(12) United States Patent
Kim

(10) Patent No.: US 6,737,688 B2
(45) Date of Patent: May 18, 2004

(54) METHOD FOR MANUFACTURING SEMICONDUCTOR DEVICE

(75) Inventor: Jong Su Kim, Kyoungki-do (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 10/330,078

(22) Filed: Dec. 30, 2002

(65) Prior Publication Data

US 2003/0211683 A1 Nov. 13, 2003

(30) Foreign Application Priority Data

May 13, 2002 (KR) ................ 10-2002-0026232

(51) Int. Cl.[7] .................. H01L 29/76; H01L 21/366

(52) U.S. Cl. .................. 257/288; 257/368; 257/510; 257/520; 438/301; 438/360; 438/361

(58) Field of Search ................ 257/288, 368, 257/374, 510, 520; 438/296, 301, 359, 360, 361

(56) References Cited

U.S. PATENT DOCUMENTS

| | | | | | |
|---|---|---|---|---|---|
| 4,819,052 A | * | 4/1989 | Hutter | ........................ | 257/378 |
| 5,094,973 A | * | 3/1992 | Pang | ........................ | 438/424 |
| 5,436,190 A | * | 7/1995 | Yang et al. | ................. | 438/296 |
| 5,923,073 A | * | 7/1999 | Aoki et al. | ................. | 257/501 |
| 6,005,279 A | * | 12/1999 | Luning | ........................ | 257/510 |
| 6,080,628 A | * | 6/2000 | Cherng | ........................ | 438/296 |
| 6,096,612 A | * | 8/2000 | Houston | .................... | 438/296 |
| 6,107,157 A | * | 8/2000 | Fazan et al. | ................ | 438/424 |
| 6,107,159 A | * | 8/2000 | Chuang | ........................ | 438/432 |
| 6,150,273 A | * | 11/2000 | Liu et al. | .................... | 438/692 |
| 6,268,264 B1 | * | 7/2001 | Tseng | ........................ | 438/424 |

* cited by examiner

*Primary Examiner*—T. N. Quach
(74) *Attorney, Agent, or Firm*—Jacobson Holman PLLC

(57) ABSTRACT

The present invention discloses a method for manufacturing a semiconductor device. A device isolation film has a shape of an insulating spacer at an interface of active regions composed of a epitaxial silicon layer in a device isolation region of a semiconductor substrate and active regions composed of a semiconductor substrate, thereby minimizing a size of the device isolation region, maximizing a size of the active regions, and achieving a high integration of the device.

8 Claims, 8 Drawing Sheets

METHOD FOR MANUFACTURING SEMICONDUCTOR DEVICE

BACKGROUND OF THE INVENTION

1. Field of the Invention

The present invention relates to a method for manufacturing a semiconductor device, and in particular to an improved method for manufacturing a semiconductor device which can achieve a high integration of the semiconductor device by minimizing an area occupied by device isolation film for defining active regions, and use the device isolation film for a unit cell and a switching device.

2. Description of the Background Art

A conventional device isolation film is a trench type and positioned along the word line between active regions formed at both sides of a word line.

FIG. 1 is a cross-sectional view illustrating a conventional semiconductor device, wherein active regions are formed in I or Z shape, and a trench type device isolation film is formed therebetween.

Referring to FIG. 1, a device isolation film 13 defining active regions is formed on a semiconductor substrate 11.

Here, the device isolation film 13 is formed by depositing a pad oxide film (not shown) and a nitride film (not shown) on the semiconductor substrate 11, etching the nitride film, the pad oxide film and a predetermined thickness of semiconductor substrate 11 via a photo-etching process using a device isolation mask (not shown) to form a trench, and filling the trench.

Thereafter, a gate electrode 17 is formed in the active regions of the semiconductor substrate 11. Here, a gate oxide film 15 is formed in the interface of the gate electrode 17 and the semiconductor substrate 11.

A low concentration impurity junction region (not shown) is formed by ion-implanting a low concentration impurity into the semiconductor substrate 11 using the gate electrode 17 as a mask.

An insulating spacer 19 is formed on the sidewalls of the gate electrode 17, and a high concentration impurity junction region (not shown) is formed by ion-implanting a high concentration impurity into the semiconductor substrate 11 using the gate electrode 17 and the insulating spacer 19 as masks, thereby forming a source/drain region (not shown).

An interlayer insulating film (not shown) is formed on the entire surface of the resultant structure, and a source region contact plug 21 and a drain region contact plug 23 are formed to contact the source/drain region through the interlayer insulating film.

As described above, the conventional method for manufacturing the semiconductor device has a disadvantage in that it cannot achieve a high integration of the device because the trench type device isolation film occupies large area. To overcome the above problem, a method for manufacturing a semiconductor device has been proposed wherein step difference is generated in the device isolation region and the insulating spacer is formed on the boundaries of the step difference. However, the proposed method fails to provide a contact margin.

SUMMARY OF THE INVENTION

Accordingly, it is an object of the present invention to provide a method for manufacturing a semiconductor device wherein two different types of active regions are alternately arranged to have a shape of a matrix for minimization of a device isolation region by forming device isolation films defining the active regions on a semiconductor substrate in a form of a spacer to turn most of the conventional device isolation regions into the active regions.

In order to achieve the above-described object of the invention, there is provided a method for manufacturing a semiconductor device including the steps of: (a) forming a stacked structure of a pad oxide film and a nitride film on a semiconductor substrate; (b) forming trenches by etching the stacked structure and the semiconductor substrate by a predetermined depth, wherein trenches are alternately arranged in a form of a matrix in the semiconductor substrate so that the trenches do not adjoin each other; (c) forming a first insulating spacer on the sidewalls of the trench; (d) selectively forming an epitaxial silicon layer in the trenches to fill the trenches and extrude upward higher than the nitride film; (e) planarizing the epitaxial silicon layer using the stacked structure of the pad oxide film and the nitride film as an etch stop layer; (f) removing the stacked structure of the pad oxide film and the nitride film to expose the semiconductor substrate to make the planarized epitaxial silicon layer extruded upward; (g) forming a second insulating spacer on a sidewall of the extruded epitaxial silicon layer so that the epitaxial silicon layer can be electrically isolated with an adjacent semiconductor substrate; (h) forming gate oxide film patterns on the epitaxial silicon layer and the semiconductor substrate, respectively; (i) forming a gate electrode on the each gate oxide film patterns; and (j) forming a source and a drain on the both sides of the gate electrode by an impurity implantation process using the gate electrode as a mask.

In addition, the first insulating spacer comprises a stacked structure of an oxide film and a nitride film.

The second insulating spacer comprises a stacked structure of an oxide film and a nitride film.

The step of planarizing the epitaxial silicon layer is performed by a chemical mechanical polishing process.

The semiconductor device is used as a display conversion device using a transistor as an individual unit system.

There is also provided a semiconductor device comprising: a semiconductor substrate, as a first active region, on which rectangular trenches are alternately formed in a form of a matrix; an epitaxial silicon layer, as a second active region, filling the trenches and extruding upward so that the surface of the epitaxial silicon layer is higher than the surface of the substrate, wherein the epitaxial silicon layer in the trenches is electrically isolated with the substrate by a first insulating spacer interposed therebetween and the extruded epitaxial silicon layer is electrically isolated with the substrate by a second insulating spacer formed on both sides of the extruded epitaxial silicon layer; a gate electrode pattern formed on the first and the second active regions interposing a gate oxide; and source and drain regions on the both sides of the gate electrode pattern in the first and the second active regions.

The first insulating spacer comprises a stacked structure of an oxide film and a nitride film.

The second insulating spacer comprises a stacked structure of an oxide film and a nitride film.

On the other hand, the principle of the present invention will now be explained.

Trenches are formed by etching rectangular device isolation regions defining rectangular active regions on a semiconductor substrate, and a selective epitaxial-growth layer filling the trenches is grown using the semiconductor substrate at the bottom of the trenches as a seed. Here, an insulating spacers are formed between the device isolation region and the active region before and after forming the selective epitaxial-growth layer.

As a result, the insulating spacer is positioned on the boundaries of the active regions composed of the selective epitaxial-growth layer in the device isolation region and the active regions composed of the semiconductor substrate, thereby forming the active regions in a matrix shape so that the active regions can separately adjoin each other and the same active regions cannot adjoin each other. Accordingly, a size of the device is minimized, and each of the transistors can be used as individual unit systems such as display conversion devices.

Here, one side of a word line passing through the respective active regions is used as a source, and the other side of the word line is used as a drain. The drain is used as a source of the adjacent word line.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

A method for manufacturing a semiconductor device in accordance with a preferred embodiment of the present invention will now be described in detail with reference to the accompanying drawings.

Figure 1:
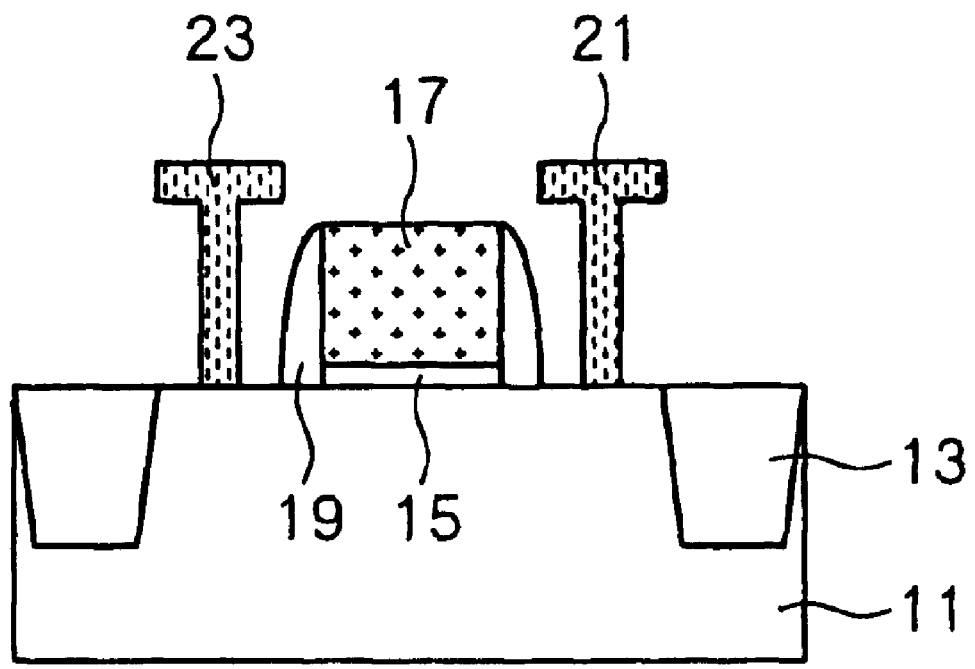
FIG. 1 is a cross-sectional view illustrating a conventional semiconductor device.
Figure 2A:
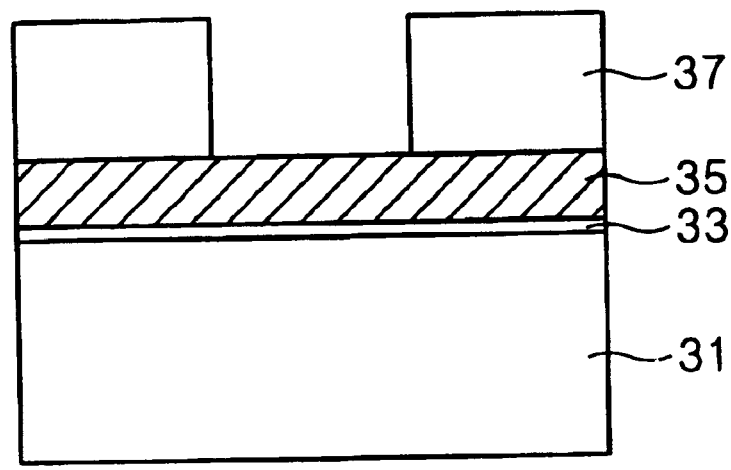
FIGS. 2a to 2i are cross-sectional views illustrating sequential steps of a method for manufacturing a semiconductor device in accordance with a preferred embodiment of the present invention.
Figure 2B:
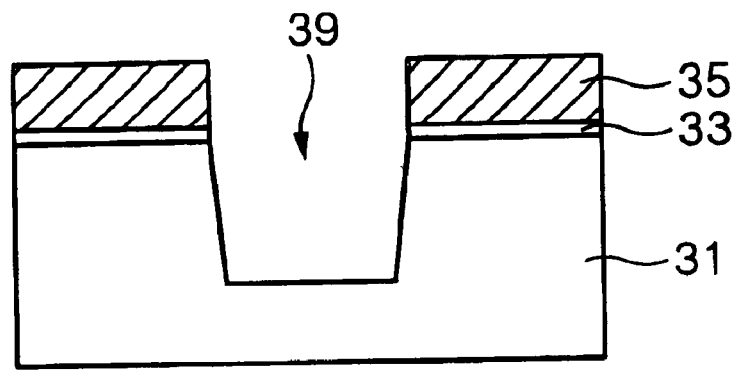
Figure 2C:
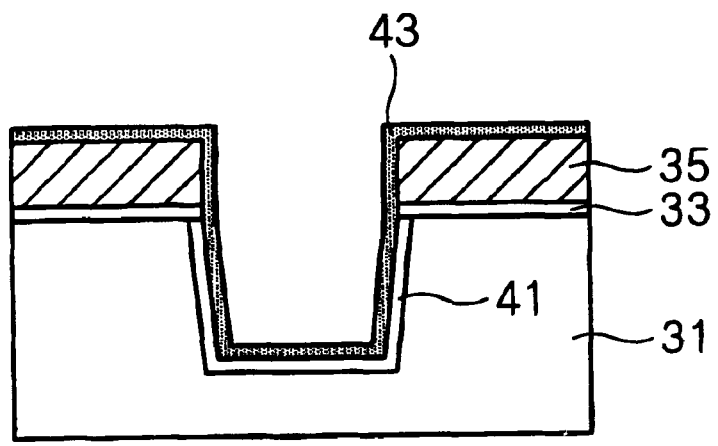
Figure 2D:
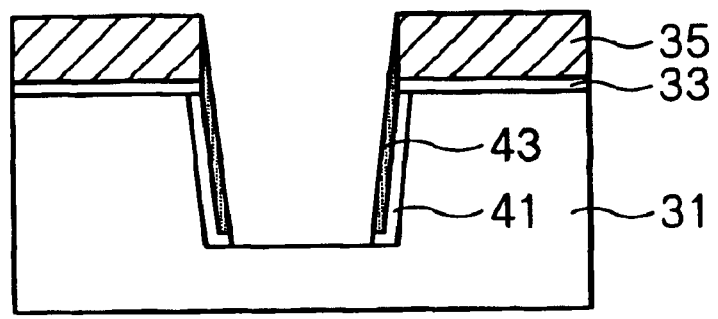
Figure 2E:
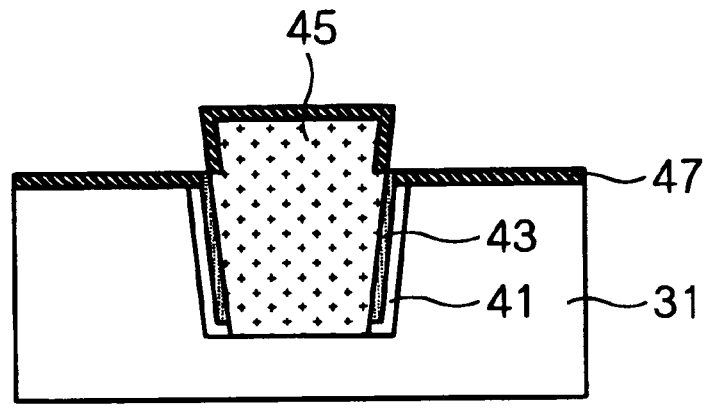
Figure 2F:
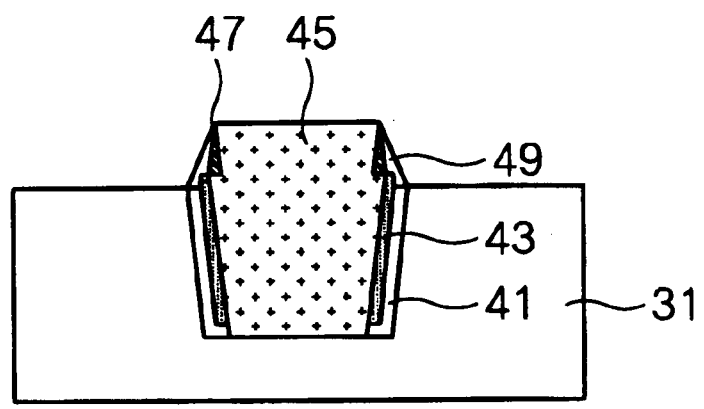
Figure 2G:
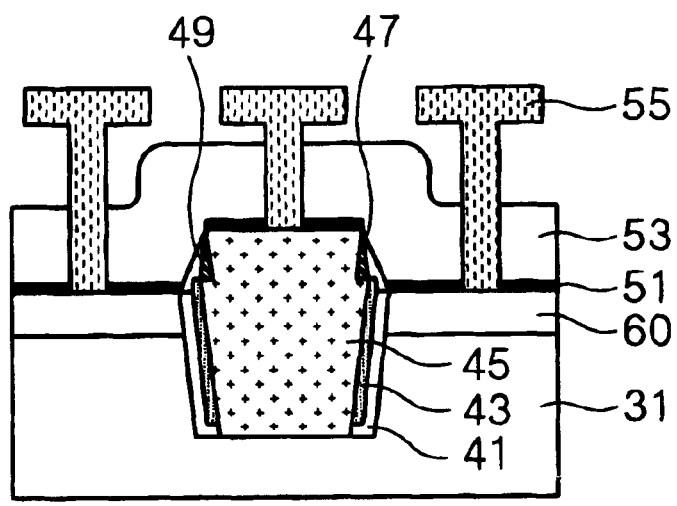
Figure 2H:
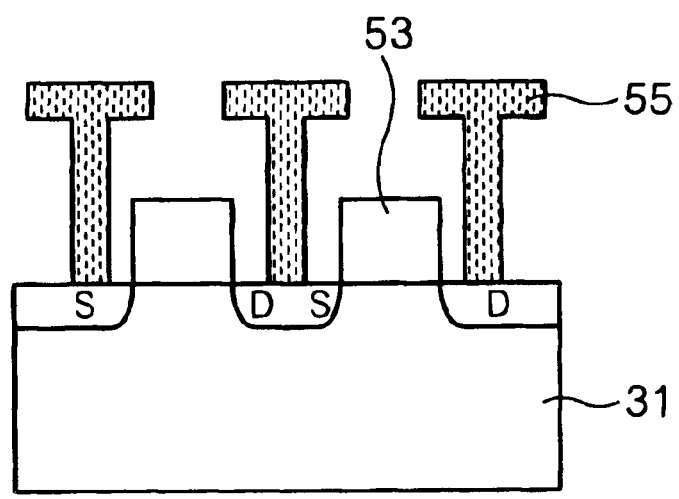
Figure 2I:
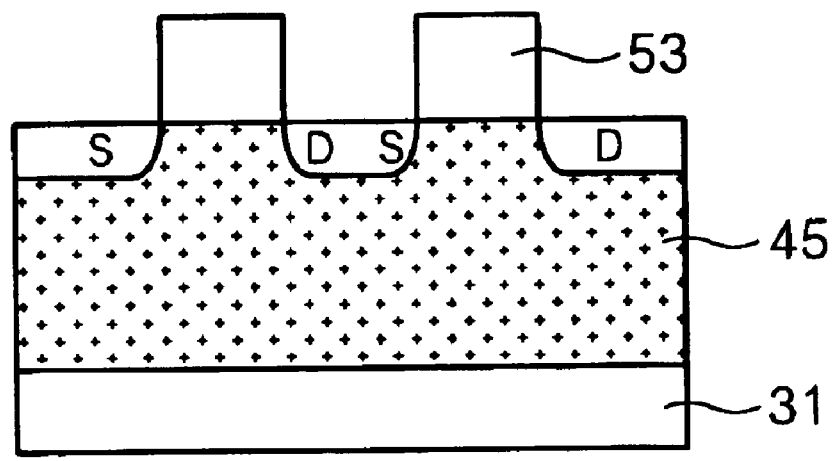
Figure 3A:
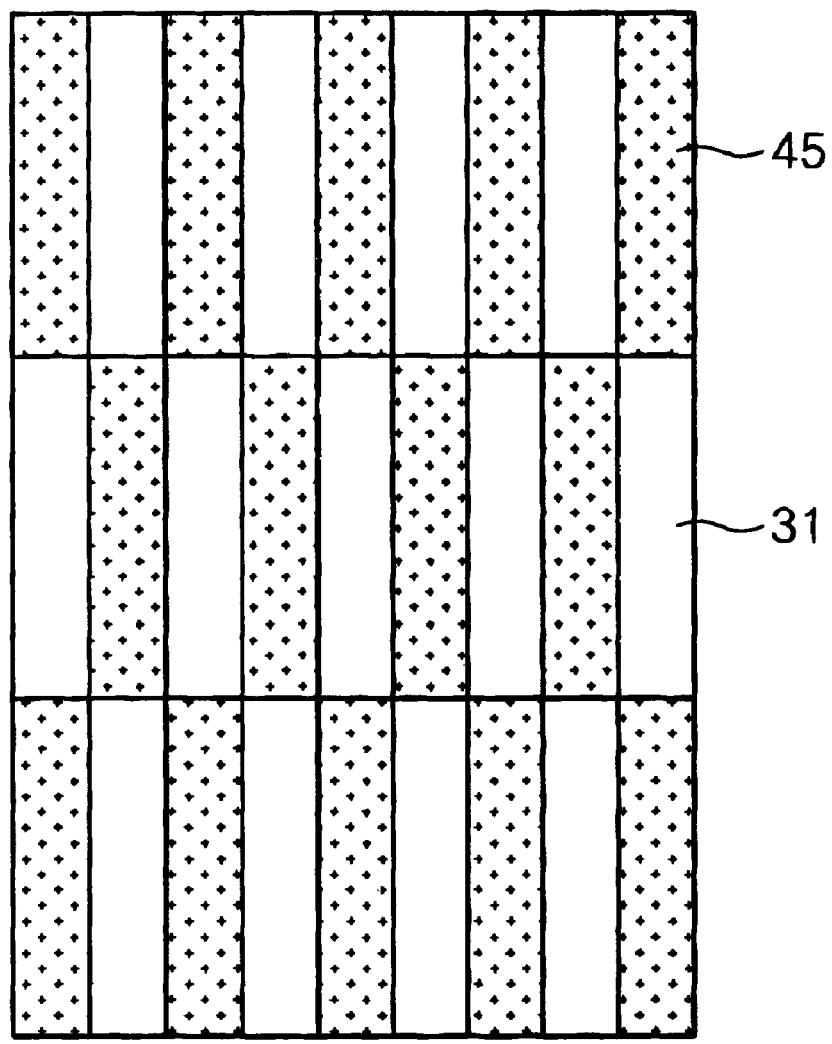
FIGS. 3a and 3b are plan views illustrating sequential steps of the method for manufacturing the semiconductor device in accordance with the preferred embodiment of the present invention.
Figure 3B:
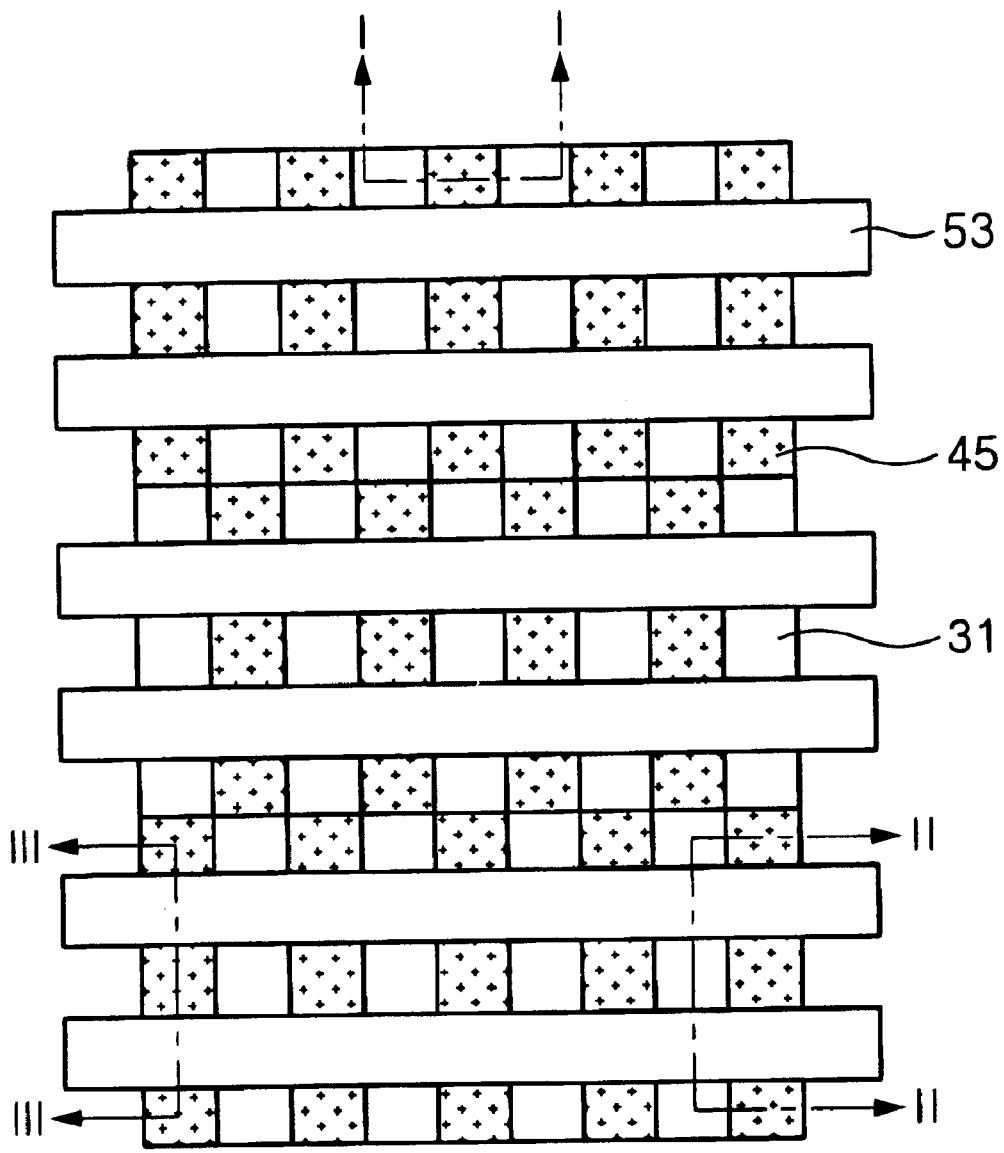

FIGS. 2a to 2g are cross-sectional views illustrating sequential steps of the method for manufacturing the semiconductor device in accordance with the preferred embodiment of the present invention, taken along line I—I of FIG. 3b, and FIGS. 2h and 2i are cross-sectional views taken along lines II—II and III—III of FIG. 3b, respectively.

Referring to FIG. 2a, a stacked structure of a pad oxide film 33 and a first nitride film 35 is formed on a semiconductor substrate 31, and a photoresist film pattern 37 is formed on the stacked structure.

Here, the photoresist film pattern 37 is formed via exposure and developing processes using a rectangular matrix shaped exposure mask, so that a side of a first region which will be etched to form as a trench and a side of a second region which will not be etched are adjacent to each other and that the first regions and the second regions are not adjacent to one another, respectively.

Referring to FIG. 2b, a rectangular trench 39 is formed by etching the stacked structure of the pad oxide film 33 and the first nitride film 35, and a predetermined thickness of semiconductor substrate 31 using the photoresist film pattern 37 as a mask, and the residual photoresist film pattern 37 is then removed.

Referring to FIG. 2c, a first thermal oxide film 41 is formed on a surface of the trench 39, and a second nitride film 43 is then formed on the entire surface of the resultant structure including the surface of the trench 39.

Referring to FIG. 2d, the second nitride film 43 and the first thermal oxide film 41 are etched back. Here, the etching process is performed vertically with respect to the semiconductor substrate 31, and the second nitride film 43 and the first thermal oxide film 41 at the bottom of the trench 39 are removed to expose the semiconductor substrate 31 at the bottom of trench 39, and to form an insulating spacer having a stacked structure of the first thermal oxide film 41 and the second nitride film 43 on the sidewalls of the trench 39.

Referring to FIG. 2e, a epitaxial silicon layer 45 is selectively grown using the exposed portion of the semiconductor substrate 31 at the bottom of the trench 39 as a seed to protrude higher than the first nitride film 35 is formed by filling the trench 39.

Thereafter, the epitaxial silicon layer 45 is planarized by performing a chemical mechanical polishing process using the stacked structure of the pad oxide film 33 and the first nitride film 35 as an etch stop layer, and the stacked structure of the pad oxide film 33 and the first nitride film 35 is then removed to expose the semiconductor substrate 31.

A second thermal oxide film 47 is formed on the surface of the exposed portion of the semiconductor substrate 31 and on the surface of the epitaxial silicon layer 45.

Referring to FIG. 2f, a third nitride film 49 is deposited on the second thermal oxide film 47, and an insulating spacer having a stacked structure of the second thermal oxide film 47 and the third nitride film 49 is then formed on the sidewalls of the epitaxial silicon layer 45 by anisotropically etching the third nitride film 49 and the second thermal oxide film 47.

Here, the active regions composed of the epitaxial silicon layer 45 and the active regions composed of the semiconductor substrate 31 are isolated by the insulating spacer having the stacked structure of the first thermal oxide film 41 and the second nitride film 43 and the insulating spacer having the stacked structure of the second thermal oxide film 47 and the third nitride film 49.

Referring to FIG. 2g, a gate oxide film 51 is formed by thermally oxidizing the exposed portion of the semiconductor substrate and the top surface of the epitaxial silicon layer 45, and a gate electrode 53 is then formed on the gate oxide film 51.

Here, the gate electrode 53 is formed by depositing a conductive layer for gate electrode (not shown) on the gate oxide film 51, and etching the conductive layer for gate electrode (not shown) and the gate oxide film 51 via photo-etching using a gate electrode mask (not shown).

Thereafter, a source/drain region 60 is formed by ion-implanting an impurity into the semiconductor substrate 31 using the gate electrode 53 as a mask. Here, the source/drain region 60 is used as a source or drain of an adjacent word line.

The insulating spacer having the stacked structure of the first thermal oxide film 41 and the second nitride film 43, and the insulating spacer having the stacked structure of the second thermal oxide film 47 and the third nitride film 49 disposed between the source/drain regions isolate the source/drain regions.

A lower insulating layer (not shown) is formed on the entire surface of the resultant structure, and a source region contact plug and a drain region contact plug are formed to contact the source region and the drain region through the lower insulating layer (not shown), respectively.

Here, reference numeral '55' denotes the source region contact plug or drain region contact plug. It can be used as the source region contact plug or drain region contact plug according to location of the gate electrode 53.

A transistor of the semiconductor device is used as a display conversion device using one transistor as an individual unit system.

FIGS. 3a and 3b are plan views illustrating sequential steps of the method for manufacturing the semiconductor device in accordance with the preferred embodiment of the present invention. FIG. 3a illustrates active regions formed in a matrix shape wherein a side of the active regions composed of the epitaxial silicon layer and a side of the active regions composed of the semiconductor substrate 31 are adjacent to each other and that active regions composed of the same material does not adjacent to each other. Referring to FIG. 3b, the gate electrode 53 is formed on the matrix-shaped active regions of FIG. 3a.

As discussed earlier, in accordance with the present invention, the device isolation film has a shape of an insulating spacer at an interface of the active regions composed of the epitaxial silicon layer in the device isolation region of the semiconductor substrate and the active regions composed of the semiconductor substrate, thereby minimizing the size of the device isolation region, maximizing the size of the active regions, and achieving the high integration of the device.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the metes and bounds of the claims, or equivalences of such metes and bounds are therefore intended to be embraced by the appended claims.

What is claimed is:

1. A method for manufacturing a semiconductor device, comprising the steps of:
   (a) forming a stacked structure of a pad oxide film and a nitride film on a semiconductor substrate;
   (b) forming trenches by etching the stacked structure and the semiconductor substrate by a predetermined depth, wherein trenches are alternately arranged in a form of a matrix in the semiconductor substrate so that the trenches do not adjoin each other;
   (c) forming a first insulating spacer on the sidewalls of the trench;
   (d) selectively forming an epitaxial silicon layer in the trenches to fill the trenches and extrude upward higher than the nitride film;
   (e) planarizing the epitaxial silicon layer using the stacked structure of the pad oxide film and the nitride film as an etch stop layer;
   (f) removing the stacked structure of the pad oxide film and the nitride film to expose the semiconductor substrate to make the planarized epitaxial silicon layer extruded upward;
   (g) forming a second insulating spacer on a sidewall of the extruded epitaxial silicon layer so that the epitaxial silicon layer can be electrically isolated with an adjacent semiconductor substrate;
   (h) forming gate oxide film patterns on the epitaxial silicon layer and the semiconductor substrate, respectively;
   (i) forming a gate electrode on the each gate oxide film patterns; and
   (j) forming a source and a drain on both sides of the gate electrode by an impurity implantation process using the gate electrode as a mask.

2. The method according to claim 1, wherein the first insulating spacer comprises a stacked structure of an oxide film and a nitride film.

3. The method according to claim 1, wherein the second insulating spacer comprises a stacked structure of an oxide film and a nitride film.

4. The method according to claim 1, wherein the step of planarizing the epitaxial silicon layer is performed by a chemical mechanical polishing process.

5. The method according to claim 1, wherein the semiconductor device is used as a display conversion device using a transistor as an individual unit system.

6. A semiconductor device comprising:
   a semiconductor substrate, as a first active region, on which rectangular trenches are alternately arranged in a form of a matrix;
   an epitaxial silicon layer, as a second active region, filling the trenches and extruding upward so that the surface of the epitaxial silicon layer is higher than the surface of the substrate, wherein the epitaxial silicon layer in the trenches is electrically isolated with the substrate by a first insulating spacer interposed therebetween and the extruded epitaxial silicon layer is electrically isolated with the substrate by a second insulating spacer formed on both sides of the extruded epitaxial silicon layer;
   a gate electrode pattern formed on the first and the second active regions interposing a gate oxide; and
   source and drain regions on both side of the gate electrode pattern in the first and the second active regions.

7. A semiconductor device according to claim 6, wherein the first insulating spacer comprises a stacked structure of an oxide film and a nitride film.

8. A semiconductor device according to claim 6, wherein the second insulating spacer comprises a stacked structure of an oxide film and a nitride film.

* * * * *